United States Patent
Rao et al.

(10) Patent No.: US 10,892,760 B1
(45) Date of Patent: Jan. 12, 2021

(54) DYNAMIC TRANSISTOR GATE OVERDRIVE FOR INPUT/OUTPUT (I/O) DRIVERS AND LEVEL SHIFTERS

(71) Applicant: QUALCOMM Incorporated, San Diego, CA (US)

(72) Inventors: Sumit Rao, San Diego, CA (US); Wilson Jianbo Chen, San Diego, CA (US); Chiew-Guan Tan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 10 days.

(21) Appl. No.: 16/653,391

(22) Filed: Oct. 15, 2019

(51) Int. Cl.
*H03K 19/0175* (2006.01)
*H03K 19/0185* (2006.01)
*H03K 19/003* (2006.01)

(52) U.S. Cl.
CPC ............ *H03K 19/018521* (2013.01); *H03K 19/00384* (2013.01); *H03K 19/017509* (2013.01); *H03K 19/017545* (2013.01)

(58) Field of Classification Search
CPC .............. H03K 19/00384; H03K 19/018521
See application file for complete search history.

(56) References Cited

U.S. PATENT DOCUMENTS

| 3,312,837 | A | * | 4/1967 | Flynn | H03K 4/94 327/130 |
| 4,567,378 | A | * | 1/1986 | Raver | H03K 6/04 326/27 |
| 5,557,223 | A | * | 9/1996 | Kuo | H03K 19/00384 326/21 |
| 6,842,058 | B2 | * | 1/2005 | McNitt | H03K 17/166 326/27 |
| 9,385,718 | B1 | * | 7/2016 | Liu | H03K 19/017509 |
| 2003/0225943 | A1 | * | 12/2003 | Yu | G06F 13/4072 710/1 |

* cited by examiner

*Primary Examiner* — Kurtis R Bahr
(74) *Attorney, Agent, or Firm* — Loza & Loza, LLP/Qualcomm

(57) ABSTRACT

An apparatus for generating an output voltage signal based on an input voltage signal. The apparatus includes a first field effect transistor (FET) including a first gate configured to receive a first gate voltage based on the input voltage signal; a second (FET) including a second gate configured to receive a second gate voltage based on the input voltage signal, wherein the first and second FETs are coupled in series between a first voltage rail and a second voltage rail, and wherein the output voltage signal is produced at an output node between the first and second FETs; and a gate overdrive circuit configured to temporarily reduce the first gate voltage during a portion of a transition of the output voltage signal from a logic low level to a logic high level.

27 Claims, 7 Drawing Sheets

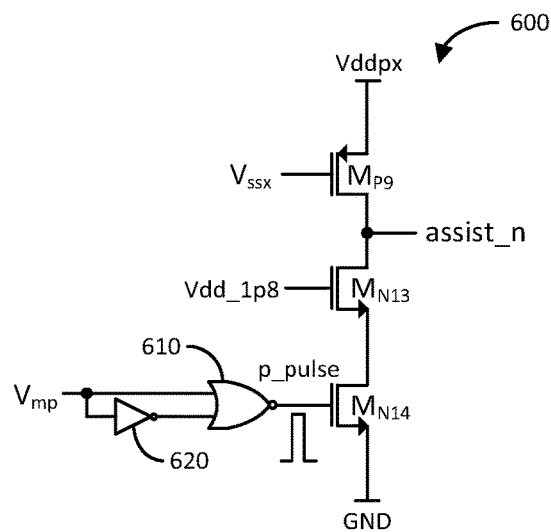
FIG. 6
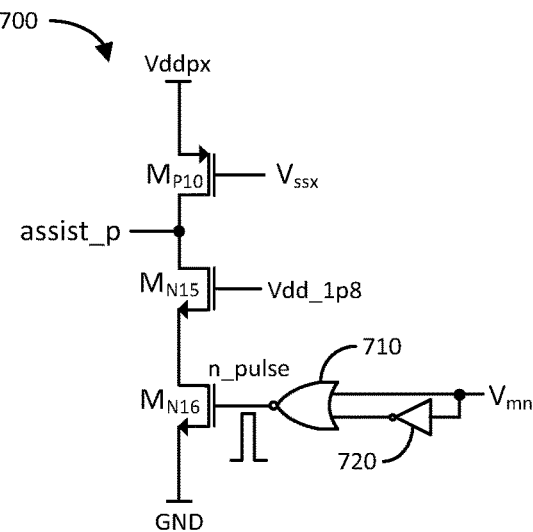
FIG. 7
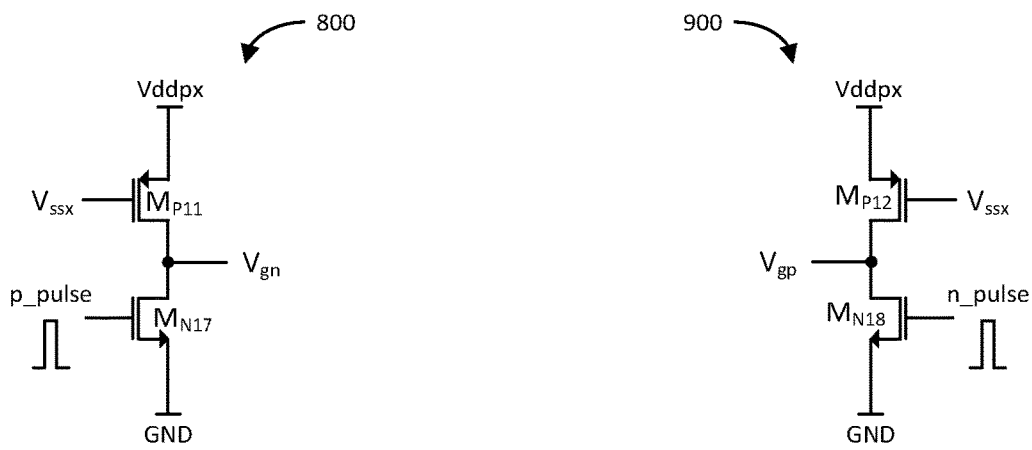
FIG. 8
FIG. 9

DYNAMIC TRANSISTOR GATE OVERDRIVE FOR INPUT/OUTPUT (I/O) DRIVERS AND LEVEL SHIFTERS

FIELD

Aspects of the present disclosure relate generally to input/output (I/O) drivers and level shifters, and in particular, to dynamic or temporary transistor gate overdrive for I/O drivers and level shifters.

DESCRIPTION OF RELATED ART

An input/output (I/O) driver typically receives an input voltage in a first voltage domain (e.g., a voltage domain suitable for digital signal processing in an integrated circuit (IC), such as a system on chip (SOC)) and generates an output voltage in a second voltage domain (e.g., a voltage domain suitable for signal transmission via metallization traces on a printed circuit board (PCB)). As an example, the input voltage may swing between a logic low level of 0 Volt (V) and a logic high level of +0.9V according to the first voltage domain, and the output voltage may swing between a logic low level of 0V and a high logic level of +3.05V according to the second voltage domain.

A level shifter may perform a similar function as discussed above with reference to the I/O driver, but may not be used to generate an output voltage for transmission via metallization traces on a PCB. As an example, a level shifter may perform an intermediate voltage level shift within an I/O driver or in other applications. For instance, a level shifter may level shift the input voltage from the first voltage domain (e.g., 0-0.9V) to an intermediate voltage domain (e.g., 0-1.8V).

In both I/O drivers and level shifters, it is often desirable to use relatively small transistors (e.g., field effect transistors (FETs)) so that they can operate at desirable high frequencies, and occupy a relatively small footprint of IC, among other benefits.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

Another aspect of the disclosure relates to an apparatus for generating an output voltage signal based on an input voltage signal. The apparatus includes a first field effect transistor (FET) including a first gate configured to receive a first gate voltage based on the input voltage signal; a second (FET) including a second gate configured to receive a second gate voltage based on the input voltage signal, wherein the first and second FETs are coupled in series between a first voltage rail and a second voltage rail, and wherein the output voltage signal is produced at an output node between the first and second FETs; and a gate overdrive circuit configured to temporarily reduce the first gate voltage during a first portion of a transition of the output voltage signal from a logic low level to a logic high level.

An aspect of the disclosure relates to a method of generating an output voltage signal based on an input voltage signal. The method includes applying a first gate voltage to a first gate of a first field effect transistor (FET) based on the input voltage signal; applying a second gate voltage to a second gate of a second (FET) based on the input voltage signal, wherein the first and second FETs are coupled in series between a first voltage rail and a second voltage rail, and wherein the output voltage signal is produced at an output node between the first and second FETs; and temporarily reducing the first gate voltage during a first portion of a transition of the output voltage signal from a logic low level to a logic high level.

Another aspect of the disclosure relates to an apparatus for generating an output voltage signal based on an input voltage signal. The apparatus includes means for applying a first gate voltage to a first gate of a first field effect transistor (FET) based on the input voltage signal; means for applying a second gate voltage to a second gate of a second (FET) based on the input voltage signal, wherein the first and second FETs are coupled in series between a first voltage rail and a second voltage rail, and wherein the output voltage signal is produced at an output node between the first and second FETs; and means for temporarily reducing the first gate voltage during a portion of a transition of the output voltage signal from a logic low level to a logic high level.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and implementations in the description are intended to include all such aspects and their equivalents.

BRIEF DESCRIPTION OF THE DRAWINGS

FIG. 6 illustrates a schematic diagram of an exemplary gate overdrive circuit for a level shifter in accordance with another aspect of the disclosure.

FIG. 7 illustrates a schematic diagram of another exemplary gate overdrive circuit for a level shifter in accordance with another aspect of the disclosure.

FIG. 8 illustrates a schematic diagram of another exemplary gate overdrive circuit for a level shifter in accordance with another aspect of the disclosure.

FIG. 9 illustrates a schematic diagram of another exemplary gate overdrive circuit for a level shifter in accordance with another aspect of the disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
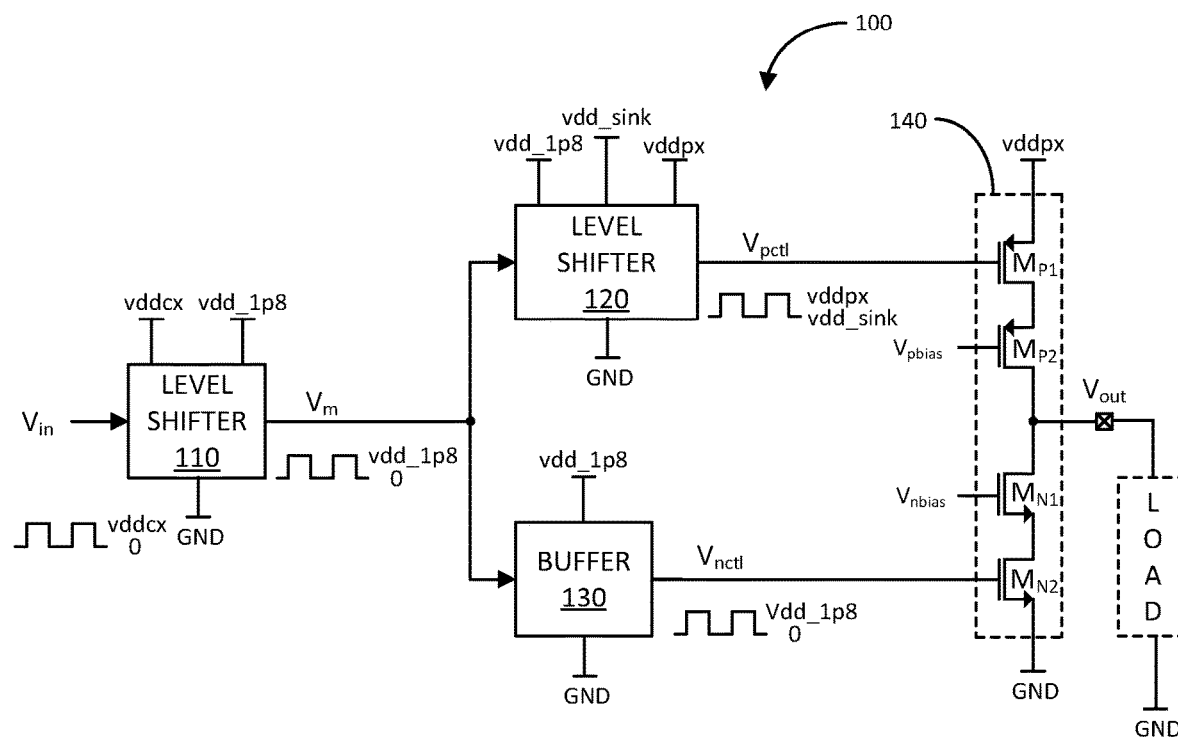
FIG. 1A illustrates a schematic diagram of an exemplary input/output (I/O) driver in accordance with an aspect of the disclosure.

FIG. 1A illustrates a schematic diagram of an exemplary input/output (I/O) driver 100 in accordance with an aspect of the disclosure. The I/O driver 100 is configured to receive an input voltage signal $V_{in}$, and generate therefrom an output voltage signal $V_{out}$. The output voltage signal $V_{out}$ may be applied across a load.

The input voltage signal $V_{in}$ may be in a first voltage domain vddcx, which may pertain to the voltage domain suitable for digital signal processing in an integrated circuit (IC), such as a silicon on chip (SOC). In the first voltage domain vddcx, the input voltage signal $V_{in}$ may swing between a first upper supply voltage vddcx and a lower supply voltage (e.g., GND or 0 Volt (V)). As an example, the first upper supply voltage vddcx may be +0.9V.

The output voltage signal $V_{out}$ may be in a second voltage domain vddpx, which may pertain to the voltage domain suitable for digital signal transmission via metallization traces of a printed circuit board (PCB) upon which the IC or SOC is mounted. In the second voltage domain vddpx, the output voltage signal $V_{out}$ may swing between a second upper supply voltage vddpx and the lower supply voltage 0V. As an example, the second upper supply voltage vddpx may be +3.05V, which is higher than the first upper supply voltage Vddcx of +0.9V.

More specifically, the I/O driver 100 includes a first level shifter 110, a second level shifter 120, a buffer 130, and an output circuit 140. The output circuit 140, in turn, includes a first p-channel metal oxide semiconductor (PMOS) field effect transistor (FET) $M_{P1}$, a second PMOS FET $M_{P2}$, a first n-channel metal oxide semiconductor (NMOS) FET $M_{N1}$, and a second NMOS FET $M_{N2}$. The first and second PMOS FETs $M_{P1}$ and $M_{P2}$ and the first and second NMOS FETs $M_{N1}$ and $M_{N2}$ are coupled in series in that order between an upper voltage rail configured to receive the second upper supply voltage vddpx and a low voltage rail configured to receive the lower supply voltage (e.g., GND or 0V). The output voltage signal $V_{out}$ is generated at a node between the second PMOS FET $M_{P2}$ and the first NMOS FET $M_{N1}$.

The first level shifter 110 is configured to level shift the input voltage signal $V_{in}$ to generate an intermediate voltage signal $V_m$. The intermediate voltage signal $V_m$ is in an intermediate voltage domain "vdd_1p8" which, for example, swings between a third upper supply voltage vdd_1p8 and the lower supply voltage (e.g., GND or 0V). As an example, the third upper supply voltage vddpx may be +1.8V, which is higher than the first upper supply voltage vddcx of +0.9V, but lower than the second upper supply voltage vddpx of +3.05V. To perform the specified level shift, the first level shifter 110 is coupled to a voltage rail configured to receive the first upper supply voltage vddcx, a voltage rail configured to receive the third upper supply voltage vdd_1p8, and a voltage rail configured to receive the lower supply voltage GND. The intermediate voltage signal $V_m$ is applied to respective inputs of the second level shifter 120 and the buffer 130.

The second level shifter 120 is configured to level shift the intermediate digital signal $V_m$ to generate a gate drive voltage $V_{PCTL}$ for the PMOS FET $M_{P1}$ of the output circuit 140. The voltage domain of the gate driver voltage $V_{PCTL}$ swings between the second upper supply voltage vddpx and a fourth upper supply voltage "vdd_sink". As an example, the fourth upper supply voltage vdd_sink may be +1.25V, which is higher than the first and lower supply voltages vddcx and GND of +0.9V and 0V, respectively, and lower than the second and third supply voltages vddpx and vdd_1p8, respectively. To perform the specified level shift, the second level shifter 120 is coupled to the voltage rail configured to receive the second upper supply voltage vddpx, the voltage rail configured to receive the third upper supply voltage vdd_1p8, the voltage rail configured to receive the lower supply voltage GND, and a voltage rail configured to receive a fourth supply voltage vdd_sink.

The buffer 130 is configured to buffer the intermediate digital signal $V_m$ to generate a gate drive voltage $V_{nctl}$ for the second NMOS FET $M_{N2}$ of the output circuit 140. As the operation is buffering, the gate drive voltage $V_{nctl}$ for the NMOS FET $M_{N2}$ is in the same voltage domain as the intermediate voltage signal $V_m$. That is, the gate drive voltage $V_{nctl}$ swings between the third upper supply voltage vdd_1p8 and the lower supply voltage GND or 0V. To perform the buffering operation, the buffer 130 is coupled to the voltage rail configured to receive the third upper supply voltage vdd_1p8, and the voltage rail configured to receive the lower supply voltage GND.

A substantially constant bias voltage $V_{pbias}$ is applied to the gate of the second PMOS FET $M_{P2}$ of the output circuit 140. As an example, the bias voltage $V_{pbias}$ may set to substantially +1.25V. Another substantially constant bias voltage $V_{nbias}$ is applied to the gate of the second NMOS FET $M_{N2}$ of the output circuit 140. As an example, the bias voltage $V_{nbias}$ may set to substantially +1.8V. The bias voltages $V_{pbias}$ and $V_{nbias}$ are configured to protect the FETs $M_{P1}$, $M_{P2}$, $M_{N1}$, and $M_{N2}$ from voltages across any terminals of these devices which would exceed their maximum voltage reliability limit. For example, if such reliability limit is 2.0V, then the bias voltages $V_{pbias}$ and $V_{nbias}$ set to +1.25 and +1.8V, respectively, prevents the voltage across any terminals of these devices from exceeding 2.0V. The maximum voltage reliability limit is relatively small (e.g., 2.0V) because the FETs $M_{P1}$, $M_{P2}$, $M_{N1}$, and $M_{N2}$ may be made relatively small to allow for faster and high frequency operations.

Figure 1B:
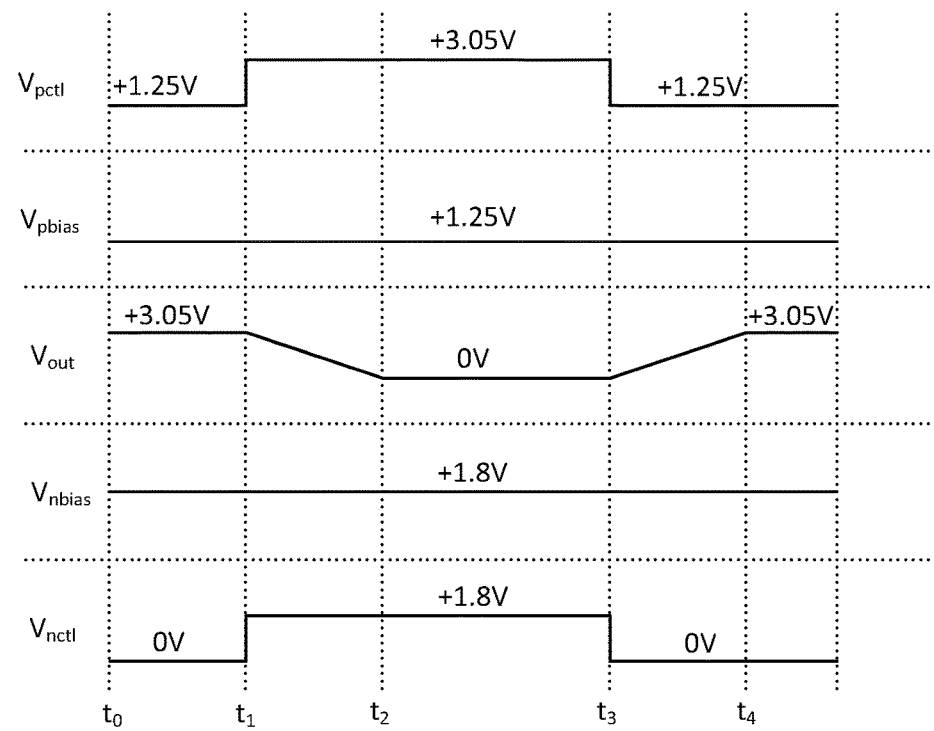
FIG. 1B illustrates a timing diagram associated with an exemplary operation of the I/O driver of FIG. 1A in accordance with another aspect of the disclosure.

FIG. 1B illustrates a timing diagram associated with an exemplary operation of the I/O driver 100 in accordance with another aspect of the disclosure. The x- or horizontal axis of the diagram represents time, and the y- or vertical axis represents voltages of various signals. These signals, from top to bottom, are the gate drive voltage $V_{pctl}$ for the first PMOS FET $M_{P1}$, the bias voltage $V_{nbias}$ for the gate of the second PMOS FET $M_{P2}$, the output voltage signal $V_{out}$, the bias voltage $V_{nbias}$ for the gate of the first NMOS FET $M_{N1}$, and the gate drive voltage $V_{nctl}$ for the second NMOS FET $M_{N2}$.

The operation of the I/O driver 100 is as follows: at time $t_0$, the input voltage signal $V_{al}$ is at a logic low level (e.g., 0V), the first level shifter 110 generates the intermediate voltage signal $V_m$ also at a logic low level (e.g., 0V), the second level shifter 120 generates the gate drive voltage $V_{pctl}$ for the first PMOS FET $M_{P1}$ at a logic low level (e.g., +1.25V), and the buffer 130 generates the gate drive voltage $V_{nctl}$ for the second NMOS FET $M_{N2}$ at a logic low level (e.g., 0V).

The gate drive voltage $V_{pctl}$ being at 1.25V causes the first PMOS FET $M_{P1}$ to turn on as the gate-to-source voltage $V_{gs}$ (e.g., vddpx−$V_{pctl}$=3.05−1.25V=1.8V) is greater than a threshold voltage $V_T$ of 0.4V. The turning on of the first PMOS FET $M_{P1}$ causes the supply voltage vddpx to be substantially applied to the source of the second PMOS FET $M_{P2}$. Since the bias voltage $V_{pbias}$ applied to the gate of the second PMOS FET $M_{P2}$ is at +1.25V, the second PMOS FET $M_{P2}$ also turns on as its gate-to-source voltage $V_{gs}$ (e.g., vddpx−$V_{pbias}$=3.05−1.25V=1.8V) is greater than the threshold voltage $V_T$ of 0.4V.

The gate drive voltage $V_{nctl}$ being at 0V causes the second NMOS FET $M_{N2}$ to turn off as the gate-to-source voltage $V_{gs}$ (e.g., $V_{nctl}$−GND=0V−0V=0V) is less than a threshold voltage $V_T$ of 0.4V. Since the second NMOS FET $M_{N2}$ is off, no current path exists between the output voltage node and the lower voltage rail GND; thus, the first NMOS FET $M_{N1}$ is also turned off. In this configuration, the output voltage signal $V_{out}$ is at a logic high level at substantially vddpx (e.g., +3.05V). Thus, in this example, the I/O driver 100 inverts the logic state of the input voltage signal $V_{in}$ to generate the output voltage signal $V_{out}$.

At time $t_1$, the input voltage signal $V_{in}$ transitions to a logic high level (e.g., +0.9V), the first level shifter 110 generates the intermediate voltage signal $V_m$ also at a logic high level (e.g., +1.8V), the second level shifter 120 generates the gate drive voltage $V_{pctl}$ for the first PMOS FET $M_{P1}$ at a logic high level (e.g., +3.05V), and the buffer 130 generates the gate drive voltage $V_{nctl}$ for the second NMOS FET $M_{N2}$ at a logic high level (e.g., +1.8V).

The gate drive voltage $V_{pctl}$ being at +3.05V causes the first PMOS FET $M_{P1}$ to turn off as the gate-to-source voltage $V_{gs}$ (e.g., vddpx−$V_{pctl}$=3.05−3.05V=0V) is less than the threshold voltage $V_T$ of 0.4V. The turning off of the first PMOS FET $M_{P1}$ prevents the supply voltage vddpx from being applied to the source of the second PMOS FET $M_{P2}$. Thus, the second PMOS FET $M_{P2}$ is also off as there is substantially no current flowing through the second PMOS FET $M_{P2}$.

The gate drive voltage $V_{nctl}$ being at +1.8V (greater than half vddpx) causes the second NMOS FET $M_{N2}$ to turn on as the gate-to-source voltage $V_{gs}$ (e.g., $V_{nctl}$−GND=1.8V−0V=1.8V) is greater than the threshold voltage $V_T$ of 0.4V. Since the second NMOS FET $M_{N2}$ is on, the ground potential is substantially applied to the source of the first NMOS FET $M_{N1}$. Since the bias voltage $V_{nbias}$ applied to the gate of the first NMOS FET $M_{N1}$ is at +1.8V, the first NMOS FET $M_{N1}$ also turns on as its gate-to-source voltage $V_{gs}$ (e.g., $V_{nbias}$−GND=1.8V−0V=1.8V) is greater than the threshold voltage $V_T$ of 0.4V. In this configuration, the output voltage signal $V_{out}$ decreases from vddpx (e.g., 3.05V) towards GND (0V) as the load typically has capacitive component which discharges when GND is applied to the output node. As illustrated, at time $t_2$, the output signal $V_{out}$ settles at substantially 0V.

At time $t_3$, the input voltage signal $V_{in}$ transitions back to a logic low level (e.g., 0V), in response: the first level shifter 110 generates the intermediate voltage signal $V_m$ also at a logic low level (e.g., 0V), the second level shifter 120 generates the gate drive voltage $V_{pctl}$ for the first PMOS FET $M_{P1}$ at a logic low level (e.g., +1.25V), and the buffer 130 generates the gate drive voltage $V_{nctl}$ for the second NMOS FET $M_{N2}$ at a logic low level (e.g., 0V).

The gate drive voltage $V_{pctl}$ being at 1.25V causes the first PMOS FET $M_{P1}$ to turn on as the gate-to-source voltage $V_{gs}$ (e.g., vddpx−$V_{pctl}$=3.05−1.25V=1.8V) is greater than the threshold voltage $V_T$ of 0.4V. The turning on of the first PMOS FET $M_{P1}$ causes the supply voltage vddpx to be substantially applied to the source of the second PMOS FET $M_{P2}$. Since the bias voltage $V_{pbias}$ applied to the gate of the second PMOS FET $M_{P2}$ is at +1.25V, the second PMOS FET $M_{P2}$ also turns on as its gate-to-source voltage $V_{gs}$ (e.g., vddpx−$V_{pbias}$=3.05−1.25V=1.8V) is greater than the threshold voltage $V_T$ of 0.4V.

The gate drive voltage $V_{nctl}$ being at 0V causes the second NMOS FET $M_{N2}$ to turn off as the gate-to-source voltage $V_{gs}$ (e.g., $V_{nctl}$−GND=0V−0V=0V) is less than the threshold voltage $V_T$ of 0.4V. Since the second NMOS FET $M_{N2}$ is off, no current path exists between the output voltage node and the lower voltage rail GND; thus, the first NMOS FET $M_{N1}$ is also turned off. In this configuration, the output voltage signal $V_{out}$ rises from GND towards vddpx (e.g., +3.05V) by vddpx being substantially applied across the capacitive load. As illustrated, at time $t_5$, the output voltage signal $V_{out}$ settles at substantially +3.05V.

There are several drawbacks with the I/O driver 100. One drawback stems from the amount of power supplies required by the I/O driver 100. For example, as discussed, power supplies are needed to generate supply voltages vddcx, vdd_1p8, vdd_sink, and vddpx. In this example, two power supplies vdd_sink and vdd_1p8 are needed to support overdrive of the gate voltage of the first PMOS FET $M_{P1}$ and the second NMOS FET $M_{N2}$, respectively. However, this may be undesirable because the relatively large number of power supplies needed requires substantial IC footprint to implement including additional pads, metal routings, vias, filtering capacitors, etc.

Another solution is to use a single power supply, for example, vdd_1p8, for both the gate drive voltage to turn on the first PMOS FET $M_{P1}$ and the second NMOS FET $M_{N2}$. However, the supply voltage vdd_1p8 of, for example, +1.8V may not be enough to sufficiently to turn on the first PMOS FET $M_{P1}$ at a desired size for this device. For example, in a worst case scenario, the supply voltage vddpx may be as low as +2.7V, the logic high level of the gate drive voltage $V_{pctl}$ may be as high as +1.95V, and the threshold voltage $V_T$ of the first PMOS FET $M_{P1}$ may be as high as 0.6V. Thus, the gate-to-source voltage $V_{gs}$ of the first PMOS FET $M_{P1}$, being at 0.8V (2.7V−1.95V), is about 0.2V higher than the threshold voltage $V_T$ of 0.6V. Accordingly, the $V_{gs}$ in the worst case scenario may not be sufficient to properly turn on the first PMOS FET $M_{P1}$ for effective operation of the I/O driver 100.

To combat this, the first PMOS FET $M_{P1}$ may be made to be, for example, four (4) times larger to sufficiently turn on with a $V_{gs}$ of 0.2V above the threshold voltage $V_T$. But the increase in FET size generally has the undesirable consequence of requiring a larger IC footprint to implement the I/O driver 100, and may adversely affect the high frequency performance of the driver.

Figure 2A:
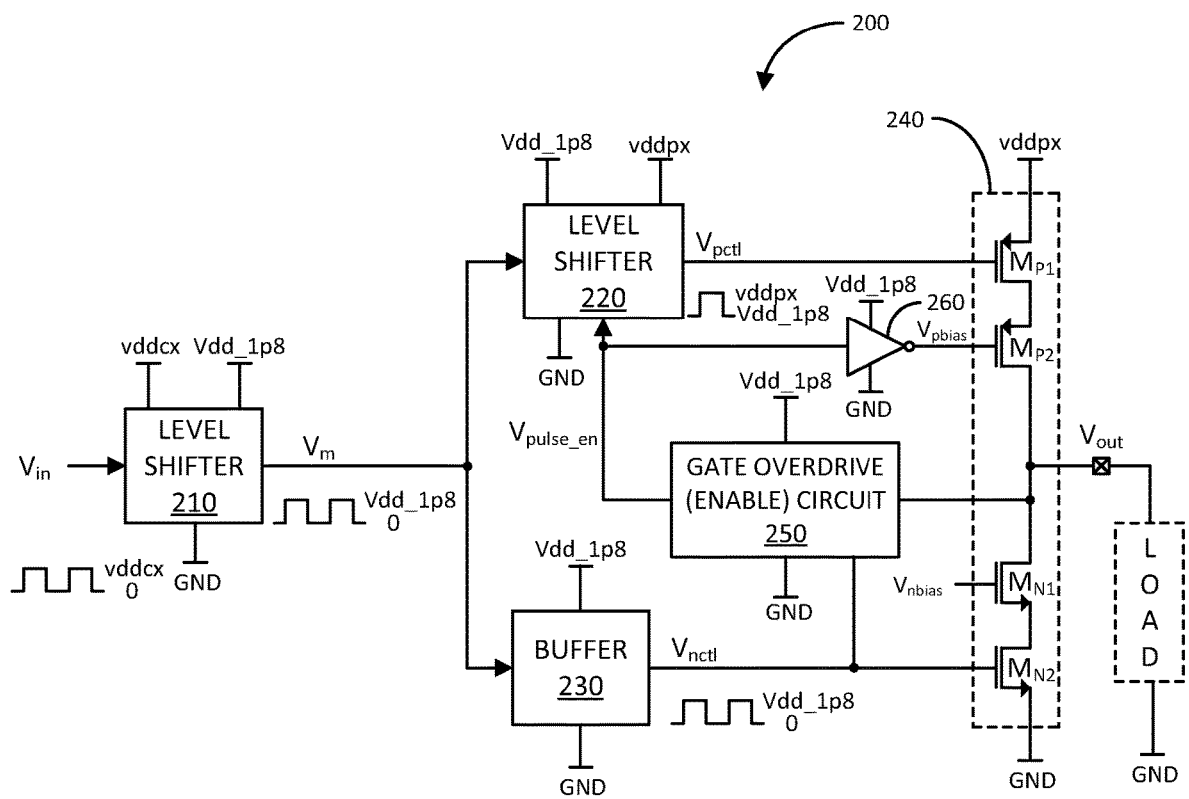
FIG. 2A illustrates a schematic diagram of another exemplary input/output (I/O) driver in accordance with another aspect of the disclosure.

FIG. 2A illustrates a schematic diagram of another exemplary input/output (I/O) driver 200 in accordance with another aspect of the disclosure. In summary, the I/O driver 200 is similar to that of I/O driver 100, but eliminates the supply voltage vdd_sink, and includes a gate overdrive circuit to dynamically or temporarily reduce the gate drive voltage $V_{pctl}$ for the first PMOS FET $M_{P1}$ below its logic low level, and dynamically or temporarily reduce the gate bias voltage $V_{pbias}$ for the second PMOS FET $M_{P2}$ in response to a negative transition of the gate drive signal $V_{nctl}$ for the second NMOS FET $M_{N2}$. When the output voltage signal $V_{out}$ rises to a certain threshold level, the gate overdrive circuit returns the gate drive voltage $V_{pctl}$ to the logic low level and the gate bias voltage $V_{pbias}$ to its non-overdrive voltage level. In other words, the gate overdrive circuit can temporarily reduce the gate drive voltage $V_{pctl}$ for the first PMOS FET $M_{P1}$ below its logic low level during a first portion of the transition of the output voltage signal $V_{out}$, and then raise the gate drive voltage $V_{pctl}$ during a second portion of the transition of the output voltage signal $V_{out}$.

In particular, the I/O driver 200 includes a first level shifter 210, a second level shifter 220, a buffer 230, an output circuit 240, a gate overdrive (enable) circuit 250, and an inverter 260. The output circuit 240 is similar to output circuit 140 previously discussed, including first and second PMOS FETs $M_{P1}$ and $M_{P2}$ and first and second NMOS FETs $M_{N1}$ and $M_{N2}$ coupled in series in that order between the vddpx voltage rail and the GND voltage rail. An output voltage signal $V_{out}$ is generated at a node between the second PMOS FET $M_{P1}$ and the first NMOS FET $M_{N1}$. The output voltage signal $V_{out}$ may be provided across a load.

The first level shifter 210 operates similar to the first level shifter 110 previously discussed in detail. That is, the first level shifter 210 level shifts an input voltage signal $V_{in}$ in the first voltage domain vddcx to generate the intermediate voltage signal $V_m$ in the third voltage domain vdd_1p8. As discussed, the first level shifter 210 is coupled to the vddcx, vdd_1p8, and GND voltage rails. The intermediate voltage signal $V_m$ is provided to the second level shifter 220 and the buffer 230.

The buffer 230 operates similar to the buffer 130 previously discussed in detail. That is, the buffer 230 buffers the intermediate voltage signal $V_m$ to generate the gate drive voltage $V_{nctl}$ for the second NMOS FET $M_{N2}$. As discussed, the buffer 230 is coupled to the vdd_1p8 and GND voltage rails.

The second level shifter 220 is different than the first level shifter 110. The second level shifter 220 level shifts the intermediate voltage signal $V_m$ to generate a gate drive voltage $V_{pctl}$ for the first PMOS FET $M_{P1}$ that swings between vddpx and vdd_1p8 during no gate overdrive. The second level shifter 220 is also responsive to a pulse enable signal $V_{pulse\_en}$ to reduce the gate drive signal $V_{pctl}$ below the logic low level vdd_1p8 to a first overdrive voltage $V_{ovd1}$ in response to an assertion of the pulse enable signal $V_{pulse\_en}$. The second level shifter 220 is also responsive to the pulse enable signal $V_{pulse\_en}$ to raise the gate control voltage $V_{pctl}$ from the first overdrive voltage $V_{ovd1}$ to the logic low level vdd_1p8 in response to deassertion of the pulse enable signal $V_{pulse\_en}$. In this case, the second level shifter 220 is coupled to the vdd_1p8, vddpx, and GND voltage rails, as the voltage rail vdd_sink is not needed in I/O driver 200.

The gate overdrive (enable) circuit 250 is configured to generate the pulse enable signal $V_{pulse\_en}$ based on the gate drive voltage $V_{nctl}$ for the second NMOS FET $M_{N2}$ and the output voltage signal $V_{out}$. For example, the gate overdrive (enable) circuit 250 is configured to assert the pulse enable signal $V_{pulse\_en}$ in response to the negative (falling) transition of the gate drive voltage $V_{nctl}$ for the second NMOS FET $M_{N2}$. The negative transition of the gate drive voltage $V_{nctl}$ initiates the transition of the output voltage signal $V_{out}$ from a logic low level (e.g., 0V) to a logic high level (e.g., +3.05V). When the output voltage signal $V_{out}$ reaches a certain level during its transition towards the logic high level, the gate overdrive (enable) circuit 250 deasserts the pulse enable signal $V_{pulse\_en}$.

Thus, the gate drive voltage $V_{pctl}$ is dynamically or temporarily reduced below its logic low level to drive the first PMOS FET $M_{P1}$ harder to assist the transition of the output voltage signal $V_{out}$ to substantially vddpx. When the output voltage signal $V_{out}$ has risen to a certain level above GND (and below vddpx), the gate drive voltage $V_{pctl}$ is returned to the logic low level so that the first PMOS FET $M_{P1}$ is driven normally for the remaining portion of the transition of the output voltage signal $V_{out}$ towards substantially vddpx.

The pulse enable signal $V_{pulse\_en}$ is inverted by the inverter 260 to generate the bias voltage $V_{pbias}$ for the second PMOS FET $M_{P2}$. Thus, when the pulse enable signal deasserted at a logic low level of 0V, the inverter 260 generates the bias $V_{pulse\_en}$ is voltage $V_{pbias}$ at vdd_1p8 (e.g., +1.8V). When the pulse enable signal $V_{pulse\_en}$ is asserted at a logic high level of vdd_1p8 (e.g., +1.8V) to cause the level shifter 220 to generate the gate drive voltage $V_{pctl}$ at the first overdrive level $V_{ovd1}$, the inverter 260 inverts the logic high level of vdd_1p8 (e.g., +1.8V) to generate the bias voltage $V_{pbias}$ at a second overdrive voltage level $V_{ovd2}$ (e.g., 0V). The overdrive gate voltages $V_{ovd1}$ and $V_{ovd2}$ applied to the gates of the first and second PMOS FETs $M_{P1}$ and $M_{P2}$ substantially coincidental assists the transition of the output voltage signal $V_{out}$ from GND to vddpx. When the output voltage signal $V_{out}$ has risen to a certain level during its transition towards vddpx, the gate overdrive (enable) circuit 250 deasserts the pulse enable signal $V_{pulse\_en}$ to return $V_{pctl}$ and $V_{pbias}$ to vdd_1p8 (non-overdrive level) for the remaining portion of the transition of the output voltage signal $V_{out}$ towards vddpx.

The operation of the first and second NMOS FETs $M_{N1}$ and $M_{N2}$ is similar to the operation of the same FETs in I/O driver 100, as previously discussed in detail.

Figure 2B:
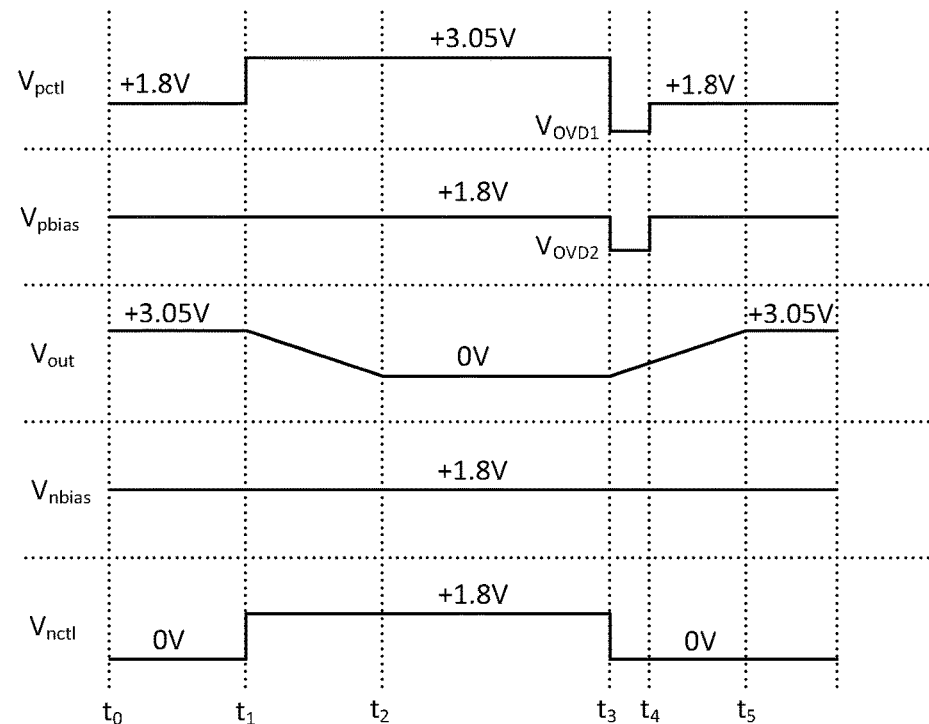
FIG. 2B illustrates a timing diagram associated with an exemplary operation of the I/O driver of FIG. 2A in accordance with another aspect of the disclosure.

FIG. 2B illustrates a timing diagram associated with an exemplary operation of the I/O driver 200 in accordance with another aspect of the disclosure. Similar to the timing diagram of FIG. 1B, the x- or horizontal axis of the diagram represents time, and the y- or vertical axis represents voltages of various signals. These signals, from top to bottom, are the gate drive voltage $V_{pctl}$ for the first PMOS FET $M_{P1}$, the bias voltage $V_{pbias}$ for the gate of the second PMOS FET $M_{P2}$, the output voltage signal $V_{out}$, the bias voltage $V_{pbias}$ for the gate of the first NMOS FET $M_{N1}$, and the gate drive voltage $V_{nctl}$ for the second NMOS FET $M_{N2}$.

The operation of the I/O driver 200 is as follows: at time to, the input digital signal $V_{al}$ is at a logic low level (e.g., 0V), the first level shifter 210 generates the intermediate voltage signal $V_m$ at a logic low level (e.g., 0V), the second level shifter 220 generates the gate drive voltage $V_{pctl}$ for the first PMOS FET $M_{P1}$ at a logic low level (e.g., +1.8V), and the buffer 230 generates the gate drive voltage $V_{nctl}$ for the second NMOS FET $M_{N2}$ at a logic low level (e.g., 0V).

The gate drive voltage $V_{pctl}$ being at +1.8V causes the first PMOS FET $M_{P1}$ to turn on as the gate-to-source voltage $V_{gs}$ (e.g., vddpx−$V_{pctl}$=3.05−1.8V=1.25V) is greater than the threshold voltage $V_T$ of 0.4V. The turning on of the first PMOS FET $M_{P1}$ causes the supply voltage vddpx to be substantially applied to the source of the second PMOS FET $M_{P2}$. Since the bias voltage $V_{pbias}$ applied to the gate of the second PMOS FET $M_{P2}$ is at +1.8V, the second PMOS FET $M_{P2}$ also turns on as its gate-to-source voltage $V_{gs}$ (e.g., vddpx−$V_{pbias}$=3.05−1.8V=1.25V) is greater than the threshold voltage $V_T$ of 0.4V.

The gate drive voltage $V_{nctl}$ being at 0V causes the second NMOS FET $M_{N2}$ to turn off as the gate-to-source voltage $V_{gs}$ (e.g., $V_{nctl}$−GND=0V−0V=0V) is less than the threshold voltage $V_T$ of 0.4V. Since the second NMOS FET $M_{N2}$ is off, no current path exists between the output voltage node and the lower voltage rail GND; thus, the first NMOS FET $M_{N1}$ is also turned off. In this configuration, the output voltage signal $V_{out}$ is at a logic high level at substantially vddpx (e.g., +3.05V). Thus, in this example, the I/O driver 200 inverts the logic state of the input voltage signal $V_{in}$ to generate the output voltage signal $V_{out}$.

At time $t_1$, the input voltage signal $V_{in}$ transitions to a logic high level (e.g., +0.9V), the first level shifter 210 generates the intermediate voltage signal $V_m$ at a logic high level (e.g., +1.8V), the second level shifter 220 generates the gate drive voltage $V_{pctl}$ for the first PMOS FET $M_{P1}$ at a logic high level (e.g., +3.05V), and the buffer 230 generates the gate drive voltage $V_{nctl}$ for the second NMOS FET $M_{N2}$ at a logic high level (e.g., +1.8V).

The gate drive voltage $V_{pctl}$ being at +3.05V causes the first PMOS FET $M_{P1}$ to turn off as the gate-to-source voltage $V_{gs}$ (e.g., vddpx−$V_{pctl}$=3.05−3.05V=0V) is less than the threshold voltage $V_T$ of 0.4V. The turning off of the first PMOS FET $M_{P1}$ prevents the supply voltage vddpx from being applied to the source of the second PMOS FET $M_{P2}$. Thus, the second PMOS FET $M_{P2}$ is also off as there is substantially no current flowing through the second PMOS FET $M_{P2}$.

The gate drive voltage $V_{nctl}$ being at +1.8V causes the second NMOS FET $M_{N2}$ to turn on as the gate-to-source voltage $V_{gs}$ (e.g., $V_{pctl}$−GND=1.8V−0V=1.8V) is greater than the threshold voltage $V_T$ of 0.4V. Since the second NMOS FET $M_{N2}$ is on, the ground potential is substantially applied to the source of the first NMOS FET $M_{N1}$. Since the bias voltage $V_{nbias}$ applied to the gate of the first NMOS FET $M_{N1}$ is at +1.8V, the first NMOS FET $M_{N1}$ also turns on as its gate-to-source voltage $V_{gs}$ (e.g., $V_{nbias}$−GND=1.8V−0V=1.8V) is greater than the threshold voltage $V_T$ of 0.4V. In this configuration, the output voltage signal $V_{out}$ decreases from vddpx (e.g., 3.05V) towards GND (0V) as the load typically has capacitive component which discharges when GND is applied to the output node. As illustrated, at time $t_2$, the output voltage signal $V_{out}$ settles at substantially 0V.

At time $t_3$, the input voltage signal $V_{in}$ transitions back to a logic low level (e.g., 0V), in response: the first level shifter 210 generates the intermediate voltage signal $V_m$ also at a logic low level (e.g., 0V), and the buffer 230 generates the gate drive voltage $V_{nctl}$ for the second NMOS FET $M_{N2}$ at a logic low level (e.g., 0V). In response to the negative transition of the gate drive voltage $V_{nctl}$, the gate overdrive (enable) circuit 250 asserts the pulse enable signal $V_{pulse\_en}$. In response to the asserted pulse enable signal $V_{pulse\_en}$, the level shifter 220 and the inverter 260 generate the gate drive voltage $V_{pctl}$ and the bias voltage $V_{pbias}$ at the first and second overdrive voltages $V_{ovd1}$ (e.g., +1.25V, less than half vddpx) and $V_{ovd2}$ (e.g., 0V), respectively. As discussed below, the overdrive voltages $V_{ovd1}$ and $V_{ovd2}$ turn on the first and second PMOS FETs $M_{P1}$ and $M_{P2}$ significantly hard to assist the output voltage signal $V_{out}$ in its transition from a logic low level (0V) to a logic high level (+3.05V).

More specifically, the gate drive voltage $V_{pctl}$ being at +1.25V causes the first PMOS FET $M_{P1}$ to turn on as the gate-to-source voltage $V_{gs}$ (e.g., vddpx−$V_{pctl}$=3.05−1.25V=1.8V) is greater than the threshold voltage $V_T$ of 0.4V. The turning on of the first PMOS FET $M_{P1}$ causes the supply voltage vddpx to be substantially applied to the source of the second PMOS FET $M_{P2}$. Since the bias voltage $V_{pbias}$ applied to the gate of the second PMOS FET $M_{P2}$ is at 0V, the second PMOS FET $M_{P2}$ also turns on as its gate-to-source voltage $V_{gs}$ (e.g., vddpx−$V_{pbias}$=3.05−0V=3.05V) is greater than a nominal threshold voltage $V_T$ of 0.4V.

The gate drive voltage $V_{nctl}$ being at 0V causes the second NMOS FET $M_{N2}$ to turn off as the gate-to-source voltage $V_{gs}$ (e.g., $V_{nctl}$−GND=0V−0V=0V) is less than the threshold voltage $V_T$ of 0.4V. Since the second NMOS FET $M_{N2}$ is off, no current path exists between the output voltage node and the lower voltage rail GND; thus, the first NMOS FET $M_{N1}$ is also turned off. In this configuration, the output voltage signal $V_{out}$ rises from GND towards vddpx (e.g., +3.05V) by vddpx charging the capacitive load.

When the output voltage signal $V_{out}$ has risen to a certain level between 0V and +3.05V (e.g., to +0.4V) at time $t_4$, the gate overdrive (enable) circuit 250 deasserts the pulse enable signal $V_{pulse\_en}$. In response to the deasserted pulse enable signal $V_{pulse\_en}$, the second level shifter 220 and the inverter 260 both generate the gate drive voltage $V_{pctl}$ and the bias voltage $V_{pbias}$ at +1.8V. The first and second PMOS FETs $M_{P1}$ and $M_{P2}$ are still turned on since their gate-to-source voltages $V_{gs}$ are above the threshold $V_T$, but not turned on as hard during the overdrive interval $t_3$−$t_4$. As the capacitive load may vary, the duration of the overdrive interval ($\Delta t = t_4 − t_3$) varies with the load. At time $t_5$, the output voltage signal $V_{out}$ has risen and settles at substantially vddpx (e.g., +3.05V).

An advantage of I/O driver 200 over I/O driver 100 is less power supplies are needed in I/O driver 200. For example, I/O driver 100 has power supplies for generating four (4) different supply voltages vddcx, vdd_1p8, vdd_sink, and vddpx. Whereas, I/O driver 200 has three (3) power supplies for generating vddcx, vdd_1p8, and vddpx. The fewer power supplies translates to substantial reduction in IC footprint including less numbers of pads, metal routings, vias, filtering capacitors, etc. Furthermore, the dynamic or temporary overdrive voltages $V_{ovd1}$ and $V_{ovd2}$ allow the first and second PMOS FETs $M_{P1}$ and $M_{P2}$ to sufficiently turn on even in the worst case scenario where vddpx is as low as +2.7V and the threshold voltage $V_T$ is as high as 0.6V. For instance, in the case of the first PMOS FET $M_{P1}$, the gate-to-source voltage $V_{gs}$ in the worst case may be 1.45V (e.g., 2.7V−1.25V), which is significantly higher than the worst case threshold voltage $V_T$ of 0.6V. Similarly, in the case of the second PMOS FET $M_{P2}$, the gate-to-source voltage $V_{gs}$ in the worst case may be 2.7V (e.g., 2.7V−0V), which is significantly higher than the worst case threshold voltage $V_T$ of 0.6V. Although the voltage across the second PMOS FET $M_{P2}$ is higher than its maximum reliability limit (e.g., 2.0V), the reliability of the second PMOS FET $M_{P2}$ is maintained because of the short duration of the overdrive interval $t_3$−$t_4$.

Figure 3:
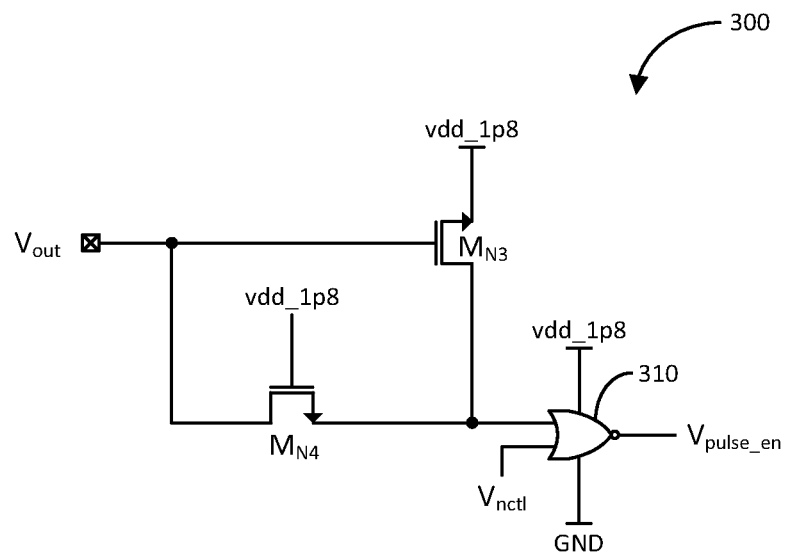
FIG. 3 illustrates a schematic diagram of an exemplary gate overdrive (enable) circuit in accordance with another aspect of the disclosure.

FIG. 3 illustrates a schematic diagram of an exemplary gate overdrive (enable) circuit 300 in accordance with another aspect of the disclosure. The gate overdrive (enable) circuit 300 may be an exemplary detailed implementation of the gate overdrive (enable) circuit 250 previously discussed. As discussed, the gate overdrive (enable) circuit 300 is configured to assert the pulse enable signal $V_{pulse\_en}$ in response to a negative transition of the gate drive voltage $V_{nctl}$ for the second NMOS FET $M_{N2}$. The gate overdrive (enable) circuit 300 is also configured to deassert the pulse enable signal $V_{pulse\_en}$ in response to the output voltage signal $V_{out}$ rising to a certain voltage level during its transition from GND to vddpx.

In particular, the gate overdrive (enable) circuit 300 includes NMOS FETs $M_{N3}$ and $M_{N4}$, and a NOR gate 310. The output voltage signal $V_{out}$ is applied to the gate and source of the NMOS FETs $M_{N3}$ and $M_{N4}$, respectively. The supply voltage vdd_1p8 is applied to the source of the NMOS FET $M_{N3}$. The drain and source of the first and second NMOS FETs $M_{N3}$ and $M_{N4}$ are coupled to a first input of the NOR gate 310, respectively. The gate drive voltage $V_{nctl}$ for the second NMOS FET $M_{N2}$ of the output circuit 240 is applied to a second input of the NOR gate 310. The NOR gate 310 is coupled to voltage rails vdd_1p8 and GND. The NOR gate 310 includes an output configured to generate the pulse enable signal $V_{pulse\_en}$.

In operation, with additional reference to FIG. 2B, immediately before time $t_3$, the gate drive voltage $V_{nctl}$ is at a logic high level and the output voltage signal $V_{out}$ is at 0V. The supply voltage vdd_1p8 being applied to the gate of the NMOS FET $M_{N4}$ causes the FET to turn on; thereby, providing a logic low level (0V) to the first input of the NOR gate 310. The logic high level of the gate drive voltage $V_{nctl}$ is applied to the second input of the NOR gate 310. In response to a logic zero and a logic one applied to its respective inputs, the NOR gate 310 generates the pulse enable signal $V_{pulse\_en}$ at a low logic voltage or deasserted level.

At time $t_3$, the gate drive voltage $V_{nctl}$ transitions from a logic high level to a logic low level (e.g., a negative transition). Accordingly, the inputs to the NOR gate 310 are now both at low logic levels. In response, the NOR gate 310 generates the pulse enable signal $V_{pulse\_en}$ at a logic high level or asserted level. This initiates the beginning of the overdrive interval $t_3$–$t_4$, where the gate drive voltage $V_{pctl}$ and the bias voltage $V_{pbias}$ for the gates of the first and second PMOS FETs $M_{P1}$ and $M_{Pg}$ are at their overdrive levels $V_{ovd1}$ and $V_{ovd2}$, respectively.

When the output voltage signal $V_{out}$ rises to substantially at or above the threshold voltage $V_T$ of the NMOS FET $M_{N3}$, the NMOS FET $M_{N3}$ turns on and applies the logic high level vdd_1p8 to the first input of the NOR gate 310. The logic high level vdd_1p8 at the source of the NMOS FET $M_{N4}$ causes the fourth NMOS FET $M_{N4}$ to turn off. As the inputs to the NOR gate 310 are now logic high and low, the NOR gate 310 generates the pulse enable signal $V_{pulse\_en}$ at a logic low level or deasserted level. This terminates the overdrive interval $t_3$–$t_4$. Thus, the overdrive interval $t_3$–$t_4$ is commenced when the gate drive voltage $V_{nctl}$ has a negative transition, and ends when the output voltage signal $V_{out}$ has risen to the threshold voltage $V_T$ of the NMOS FET $M_{N3}$.

Figure 4:
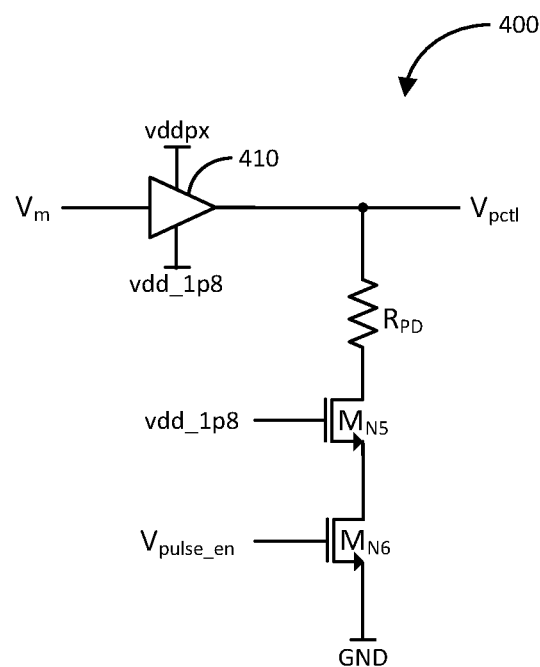
FIG. 4 illustrates a schematic diagram of an exemplary gate overdrive (voltage generating) circuit in accordance with another aspect of the disclosure.

FIG. 4 illustrates a schematic diagram of an exemplary level shifter 400 in accordance with another aspect of the disclosure. The level shifter 400 may be an exemplary detailed implementation of the second level shifter 220 previously discussed. The level shifter 400 is configured to generate the gate drive voltage $V_{pctl}$ for the first PMOS FET $M_{P1}$ in response to the intermediate voltage signal $V_m$ and the pulse enable signal $V_{pulse\_en}$. During the non-overdrive interval (when the pulse enable signal $V_{pulse\_en}$ is deasserted), the level shifter 400 is configured to generate the gate drive voltage $V_{pctl}$ to follow the logic state of the intermediate voltage signal $V_m$ (e.g., when $V_m$ is at vdd_1p8, $V_{pctl}$ is at vddpx, and when $V_m$ is at GND, $V_{pctl}$ is at vdd_1p8). During the overdrive interval (when the pulse enable signal $V_{pulse\_en}$ is deasserted), the level shifter 400 is configured to generate gate drive voltage $V_{pctl}$ at the first overdrive voltage $V_{ovd1}$ (e.g., +1.25V).

In particular, the level shifter 400 includes a level shifting component 410, a resistor $R_{PD}$, an NMOS FET $M_{N5}$, and another NMOS FET $M_{N6}$. The level shifting component 410 is configured to receive the intermediate voltage signal $V_m$ and generate the gate drive voltage $V_{pctl}$ for the first PMOS FET $M_{P1}$. The level shifting component 410 is coupled to the vddpx and vdd_1p8 voltage rails. The resistor $R_{PD}$, NMOS FET $M_{N5}$, and NMOS FET $M_{N6}$ are coupled in series between the output of the level shifting component 410 and the lower voltage rail GND. The supply voltage vdd_1p8 is applied to the gate of the NMOS FET $M_{N5}$ for overvoltage protection purposes. The pulse enable signal $V_{pulse\_en}$ is applied to the gate of the NMOS FET $M_{N6}$.

In operation, when the pulse enable signal $V_{pulse\_en}$ is deasserted, the current path between the output of the level shifting component 410 and GND is blocked by the turned off NMOS FET $M_{N6}$. Accordingly, the level shifting component 410 is configured to level shift the intermediate voltage signal $V_m$ to generate the gate drive voltage $V_{pctl}$ for the first PMOS FET $M_{P1}$. As discussed, the intermediate voltage signal $V_m$ varies between 0V (logic low) and vdd_1p8 (logic high), and the gate drive voltage $V_{pctl}$ varies between vdd_1p8 (logic low) and vddpx (logic high).

When the pulse enable signal $V_{pulse\_en}$ is asserted during the overdrive interval, a current path exists between the output of the level shifting component 410 and GND because of the turned on NMOS FET $M_{N6}$. During this interval, the level shifting component 410 is attempting to set the gate drive voltage $V_{pctl}$ at the logic low level (vdd_1p8). The current path between the output of the level shifting component 410 and GND reduces the gate drive voltage $V_{pctl}$ in accordance with the following relationship:

$$V_{pctl} = vdd\_1p8 * (R_{PD} + R_{D5} + R_{D6}) / (R_{PD} + R_{D5} + R_{D6} + Out\_Imped_{410})$$

where $R_{PD}$ is the resistance of resistor $R_{PD}$, $R_{D5}$ is the turned-on resistance of the NMOS FET $M_{N5}$, $R_{D6}$ is the turned-on resistance of the NMOS FET $M_{N6}$, and Out_Imped$_{410}$ is the output impedance of the level shifting component 410. When the pulse enable signal $V_{pulse\_en}$ is subsequently deasserted when the output voltage signal $V_{out}$ reaches a defined voltage level, the NMOS FET $M_{N6}$ turns off, and the gate drive voltage $V_{pctl}$ returns back to vdd_1p8.

Figure 5A:
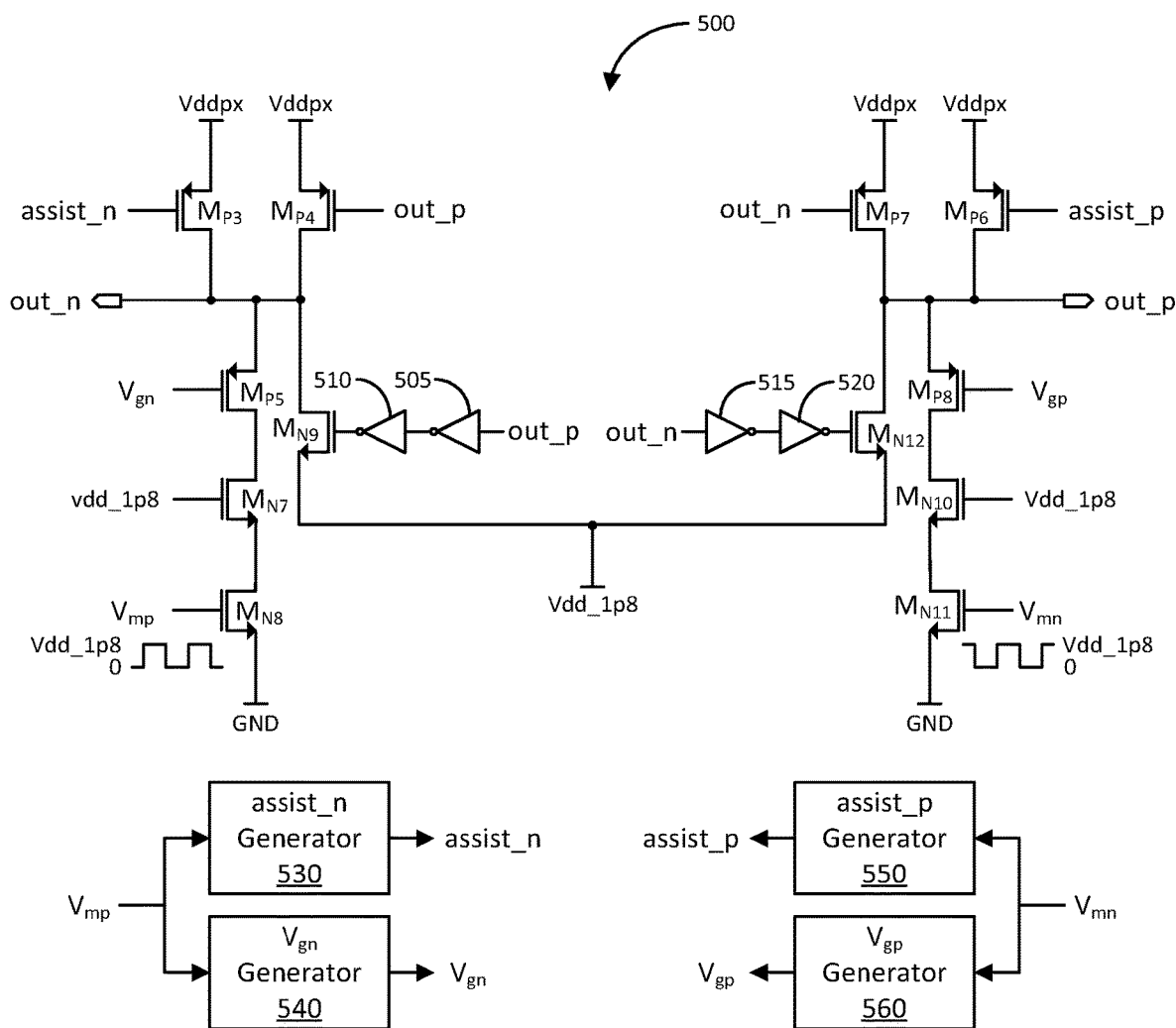
FIG. 5A illustrates a schematic diagram of an exemplary level shifter in accordance with another aspect of the disclosure.

FIG. 5A illustrates a schematic diagram of an exemplary level shifter 500 in accordance with another aspect of the disclosure. The dynamic or temporary gate overdrive is not only useful for I/O drivers, but may also be used in level shifters. The level shifter 500 is an example of a level shifter that uses dynamic or temporary gate overdrive to assist a latch (cross-coupled FETs) from changing states, as explained in more detail further herein.

In particular, the level shifter 500 includes PMOS FETs $M_{P3}$ and $M_{P4}$ coupled in parallel between a vddpx voltage rail and a negative output node at which a negative output signal out_n of the level shifter is produced. The PMOS FET $M_{P3}$ includes a gate configured to receive an assist_n signal, and the fourth PMOS FET $M_{P4}$ includes a gate configured to receive a positive output signal out_p of the level shifter 500. Accordingly, the level shifter 500 is configured to generate an output differential signal out_p/out_n.

The level shifter 500 further includes a PMOS FET $M_{P5}$, an NMOS FET $M_{N7}$, and another NMOS FET $M_{N8}$ coupled between the negative output node and a lower voltage rail GND. The PMOS FET $M_{P5}$ includes a gate configured to receive a gate overdrive voltage $V_{gn}$, the NMOS FET $M_{N7}$ includes a gate configured to receive a gate bias voltage vdd_1p8, and the NMOS FET $M_{N8}$ includes a gate configured to receive a positive input voltage $V_{mp}$ of an input differential signal.

The level shifter 500 further includes a first inverter 505 including an input configured to receive the positive output signal out_p, and an output coupled to an input of a second inverter 510. The second inverter 510 includes an output coupled to a gate of an NMOS FET $M_{N9}$. The NMOS FET $M_{N9}$ is coupled between the negative output node and the vdd_1p8 voltage rail.

The level shifter 500 includes PMOS FETs $M_{P6}$ and $M_{P7}$ coupled in parallel between the vddpx voltage rail and a positive output node at which the positive output signal out_p of the level shifter is produced. The PMOS FET $M_{P6}$ includes a gate configured to receive an assist_p signal, and the PMOS FET $M_{P7}$ includes a gate configured to receive the negative output signal out_n of the level shifter 500. The FETs $M_{P4}$ and $M_{P7}$ form cross-coupled transistors or a latch because the input (gate) to FET $M_{P4}$ is generated at the output (drain) of FET $M_{P7}$, and the input (gate) to FET $M_{P7}$ is generated at the output (drain) of FET $M_{P4}$.

The level shifter 500 further includes an PMOS FET $M_{P8}$, an NMOS FET $M_{N10}$, and an NMOS FET $M_{N11}$ coupled between the positive output node and the lower voltage rail GND. The PMOS FET $M_{P8}$ includes a gate configured to receive a gate overdrive voltage $V_{gp}$, the NMOS FET $M_{N10}$ includes a gate configured to receive a gate bias voltage vdd_1p8, and the NMOS FET $M_{N11}$ includes a gate configured to receive a negative input voltage $V_{mn}$ of the input differential signal.

The level shifter 500 further includes a third inverter 515 including an input configured to receive the negative output signal out_n, and an output coupled to an input of a fourth inverter 520. The fourth inverter 520 includes an output coupled to a gate of an NMOS FET $M_{N12}$. The NMOS FET $M_{N12}$ is coupled between the positive output node and the vdd_1p8 voltage rail.

Additionally, the level shifter 500 includes an assist_n generator 530 configured to generate the assist_n signal for the gate of the PMOS FET $M_{P3}$. The level shifter 500 further includes a $V_{gn}$ generator 540 configured to generate the gate overdrive signal $V_{gn}$ for the gate of the PMOS FET $M_{P5}$. The level shifter 500 also includes an assist_p generator 550 configured to generate the assist_p signal for the gate of the PMOS FET $M_{M}$. The level shifter 500 further includes a $V_{gp}$ generator 560 configured to generate the gate overdrive signal $V_{gp}$ for the gate of the PMOS FET $M_{P8}$.

Figure 5B:
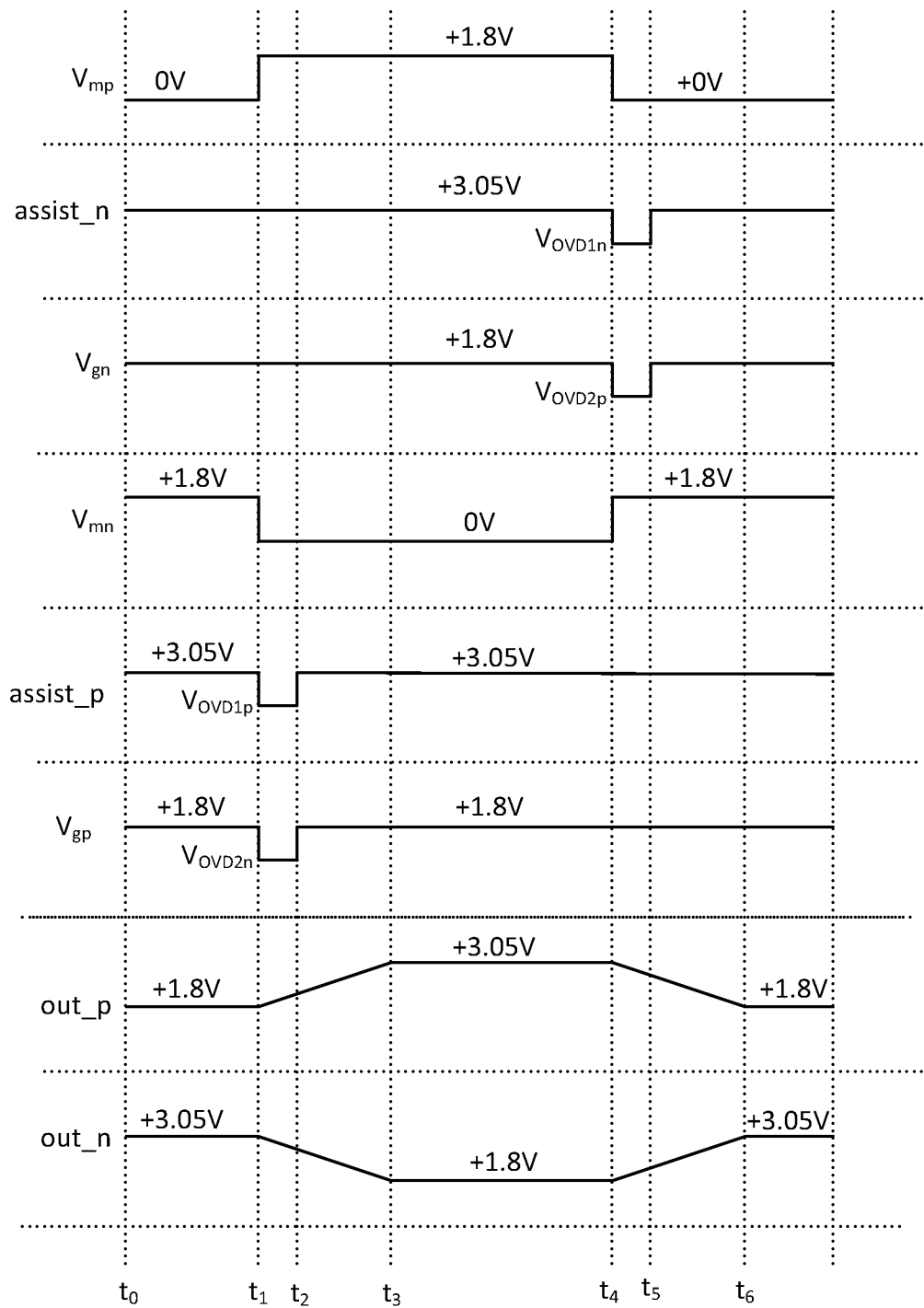
FIG. 5B illustrates a timing diagram associated with an exemplary operation of the level shifter of FIG. 5A in accordance with another aspect of the disclosure.

FIG. 5B illustrates a timing diagram associated with an exemplary operation of the level shifter 500 in accordance with another aspect of the disclosure. The x- or horizontal axis of the diagram represents time, and the y- or vertical axis represents voltages of various signals. These signals, from top to bottom, are the positive input signal $V_{mp}$, the assist_n signal for the gate of the PMOS FET $M_{P3}$, the gate bias voltage $V_{gn}$ for the gate of the PMOS FET $M_{P5}$, the negative input signal $V_{mn}$, the assist_p signal for the gate of the PMOS FET $M_{P6}$, the gate bias voltage $V_{gp}$ for the gate of the PMOS FET $M_{P8}$, the positive output signal out_p, and the negative output signal out_n.

At time $t_0$, the positive input signal $V_{mp}$ is at a logic low level at GND (0V), the assist_n is at a non-overdrive voltage level vddpx (e.g., +3.05V), the gate voltage $V_{gn}$ is at a non-overdrive voltage level at vdd_1p8 (e.g., +1.8V), the negative input signal $V_{mn}$ is at a logic high level at vdd_1p8 (e.g., +1.8V), the assist_p is at a non-overdrive voltage level at vddpx (e.g., −3.05V), the gate bias voltage $V_{gp}$ is at a non-overdrive voltage level at vdd_1p8 (e.g., +1.8V), the positive output signal out_p is at a logic low level at vdd_1p8 (e.g., +1.8V), and the negative output signal out_n is at a logic high level at vddpx (e.g., +3.05V).

In this configuration, with regard to the left-hand or out_n side of the level shifter 500: the PMOS FET $M_{P4}$ is turned on because the positive output signal out_p at the gate of $M_{P4}$ is at a logic low level at vdd_1p8 (e.g., +1.8V); the PMOS FET $M_{P3}$ is turned off as the assist_n signal at the gate of $M_{P3}$ is at the non-overdrive voltage level of vddpx (e.g., +3.05V); the PMOS FET $M_{P5}$ is turned on since the non-overdrive voltage level of vdd_1p8 (e.g., +1.8V) is at the gate of $M_{P5}$; the NMOS FETs $M_{N7}$ and $M_{N8}$ are turned off since the positive input voltage at the gate of $M_{N8}$ is at a logic low level (e.g., 0V); and the NMOS FET $M_{N9}$ is turned off since the positive output voltage out_p at the gate of $M_{N9}$ is at a logic low level at vdd_1p8 (e.g., +1.8V).

With regard to the right-hand or out_p side of the level shifter 500: the PMOS FET $M_{P7}$ is turned off because the negative output signal out_n at the gate of $M_{P7}$ is at a logic high level (e.g., +3.05V); the PMOS FET $M_{P6}$ is turned off as the assist_p signal at the gate of $M_{P6}$ is at the non-overdrive voltage level of vddpx (e.g., +3.05V); the NMOS FETs $M_{N10}$ and $M_{N11}$ are turned on since the negative input voltage at the gate of $M_{N11}$ is at a logic high level (e.g., +1.8V); the NMOS FET $M_{N12}$ is turned on since the negative output voltage out_n at the gate of $M_{N9}$ is at a logic high level vddpx (e.g., +3.05V); and the PMOS FET $M_{P8}$ is turned off since the source and gate are both at vdd_1p8 (e.g., +1.8V).

At time $t_1$, the positive and negative input voltages $V_{mp}$ and $V_{mn}$ transition to logic high and low levels, respectively. In response to the negative transition of the negative input voltage $V_{mn}$, the assist_p generator 550 and the $V_{gp}$ generator 560 generate the assist_p and $V_{gp}$ signals substantially coincidental at overdrive levels $V_{ovd1p}$ and $V_{ovd2n}$, respectively. The overdrive voltage levels for the assist_p and $V_{gp}$ signals cause the PMOS FETs $M_{P6}$ and $M_{P8}$ to turn on. The turning on of the sixth PMOS FET $M_{P6}$ applies vddpx to the out_p node to cause the positive output signal out_p to rise.

At time $t_2$, the positive and negative output voltages out_p and out_n has risen and fallen sufficiently to turn off the PMOS FET $M_{P4}$ and turn on the PMOS FET $M_{P7}$ turns on. At such time $t_2$, the assist_p generator 550 and Vgp generator 560 returns the assist_p and $V_{gp}$ signals at the non-overdrive levels vddpx (e.g., +3.05V) and vdd_1p8 (e.g., +1.8V), respectively. At time $t_3$, the positive and negative output voltages out_p and out_n now being at logic high and low levels turn on and off the NMOS FETs $M_{N9}$ and $M_{N12}$, respectively. The NMOS FET $M_{N9}$ being turned on applies vdd_1p8 to the out_n node; thus, the negative output voltage out_n becomes a logic low level at vdd_1p8. The NMOS $M_{N12}$ being turned off while the PMOS $M_{P7}$ being turned on applies vddpx to the out_p node; thus, the positive output voltage out_p becomes a logic high level at vddpx.

At time $t_4$, the positive and negative input voltages $V_{mp}$ and $V_{mn}$ transition to logic low and high levels, respectively. In response to the negative transition of the positive input voltage $V_{mp}$, the assist_n generator 530 and the $V_gp$ generator 540 generate the assist_n and $V_{gp}$ signals substantially coincidental at overdrive levels $V_{ovd1n}$ and $V_{ovd2p}$, respectively. The overdrive voltage levels for the assist_n and $V_{gn}$ signals cause the PMOS FETs $M_{P3}$ and $M_{P5}$ to turn on. The turning on of the PMOS FET $M_{P3}$ applies vddpx to the out_n node to cause the negative output signal out_n to rise.

At time $t_5$, the positive and negative output voltages out_p and out_n has fallen and risen sufficiently to turn on the PMOS FET $M_{P4}$ and turn off the PMOS FET $M_{P7}$ turns on. At such time $t_5$, the assist_n generator 530 and $V_{gn}$ generator 540 return the assist_n and $V_{gn}$ signals at the non-overdrive levels vddpx (e.g., +3.05V) and vdd_1p8 (e.g., +1.8V), respectively. At time $t_6$, the positive and negative output voltages out_n and out_p have transitioned to logic high and low levels to turn on and off the NMOS FETs $M_{N12}$ and $M_{N9}$, respectively. The NMOS FET $M_{N12}$ being turned on applies vdd_1p8 to the out_p node; thus, the positive output voltage out_p becomes a logic low level at vdd_1p8. The NMOS $M_{N9}$ being turned off while the PMOS $M_{P4}$ being turned on applies vddpx to the out_n node; thus, the negative output voltage out_n becomes a logic high level at vddpx.

FIG. 6 illustrates a schematic diagram of an exemplary assist_n generator 600 in accordance with another aspect of the disclosure. The assist_n generator 600 may be an exemplary detailed implementation of the assist_n generator 530 previously discussed.

The assist_n generator 600 includes a NOR gate 610, an inverter 620, a PMOS FET $M_{P9}$, an NMOS FET $M_{N13}$, and another NMOS FET $M_{N14}$. A first input of the NOR gate 610 and an input of the inverter 620 is configured to receive the positive input signal $V_{mp}$. The inverter 620 includes an output coupled to a second input of the NOR gate 610. The PMOS FET $M_{P9}$, NMOS FET $M_{N13}$, and NMOS FET $M_{N14}$ are coupled in series in that order between the vddpx voltage rail and the GND voltage rail. A bias voltage $V_{ssx}$ is applied to a gate of PMOS FET $M_{P9}$. A bias voltage vdd_1p8 for over-voltage protection is applied to a gate of NMOS FET $M_{N13}$. The NOR gate 610 includes an output coupled to a gate of the NMOS FET $M_{N14}$. An assist_n signal is generated at a node between the PMOS FET $M_{P9}$ and the NMOS FET $M_{N13}$, which is substantially at vddpx when NMOS FET $MN_{14}$ is turned off.

The NOR gate 610 is configured to generate a pulse p_pulse in response to a negative transition of the positive input voltage Vmp. The width of the pulse p_pulse is determined by the delay of the inverter 620, which, unlike the width of the pulse enable signal $V_{pulse\_en}$ of I/O driver 200, is independent of the output voltage signal. The pulse p_pulse temporarily turns on the NMOS FET $M_{N14}$. The turning on of NMOS FET $M_{N14}$ lowers the assist_n voltage based on vddpx multiplied by a ratio of the sum of the turn-on resistances of the NMOS FETS $M_{N13}$ and $M_{N14}$ to the sum of the turn-on resistances of the PMOS FET $M_{P9}$, NMOS FETs $M_{N13}$ and $M_{N14}$. Accordingly, in response to the negative transition of the positive input voltage $V_{mp}$, the assist_n is lowered to the gate overdrive voltage $V_{ovd1n}$, as previously discussed in detail in connection with level shifter 500.

FIG. 7 illustrates a schematic diagram of an exemplary assist_p generator 700 in accordance with another aspect of the disclosure. The assist_p generator 700 may be an exemplary detailed implementation of the assist_p generator 550 previously discussed.

The assist_p generator 700 includes a NOR gate 710, an inverter 720, a PMOS FET $M_{P10}$, an NMOS FET $M_{N15}$, and an NMOS FET $M_{N16}$. A first input of the NOR gate 710 and an input of the inverter 720 is configured to receive the negative input signal $V_{mn}$. The inverter 720 includes an output coupled to a second input of the NOR gate 710. The PMOS FET $M_{P10}$, NMOS FET $M_{N15}$, and NMOS FET $M_{N16}$ are coupled in series in that order between the vddpx voltage rail and the GND voltage rail. A bias voltage $V_{ssx}$ is applied to a gate of PMOS FET $M_{P10}$. A bias voltage vdd_1p8 for over-voltage protection purpose is applied to a gate of NMOS FET $M_{N15}$. The NOR gate 710 includes an output coupled to a gate of the NMOS FET $M_{N16}$. An assist_p signal is generated at a node between the PMOS FET $M_{P10}$ and the NMOS FET $M_{N15}$, which is substantially at vddpx when NMOS FET $MN_{16}$ is turned off.

The NOR gate 710 is configured to generate a pulse n_pulse in response to a negative transition of the negative input voltage $V_{mn}$. The width of the pulse n_pulse is determined by the delay of the inverter 720. The pulse n_pulse temporarily turns on the NMOS FET $M_{N16}$. The turning on of NMOS FET $M_{N16}$ lowers the assist_p voltage based on vddpx multiplied by a ratio of the sum of the turn-on resistances of the NMOS FETs $M_{N15}$ and $M_{N16}$ to the sum of the turn-on resistances of the PMOS FET $M_{P10}$, NMOS FETS $M_{N15}$ and $M_{N16}$. Accordingly, in response to the negative transition of the negative input voltage $V_{mn}$, the assist_p signal is lowered to the overdrive voltage $V_{ovd1p}$, as previously discussed in detail in connection with level shifter 500.

FIG. 8 illustrates a schematic diagram of another exemplary $V_{gn}$ generator 800 in accordance with another aspect of the disclosure. The $V_{gn}$ generator 800 may be an exemplary detailed implementation of the $V_{gn}$ generator 540 previously discussed.

The $V_{gn}$ generator 800 includes a PMOS FET $M_{P11}$ and an NMOS FET $M_{N17}$ coupled in series in that order between the vddpx voltage rail and the GND voltage rail. A bias voltage $V_{ssx}$ is applied to a gate of the PMOS FET $M_{P11}$. The NMOS FET $M_{N17}$ is configured to receive the p_pulse generated by the assist_n generator 600 previously discussed. The gate voltage $V_{gn}$ is generated at a node between the PMOS FET $M_{P11}$ and the NMOS FET $M_{N17}$.

In operation, when the pulse p_pulse is not being generated and NMOS FET $M_{N17}$ is turned off, the gate voltage $V_{gn}$ is at substantially vddpx. When the pulse p_pulse is generated in response to a negative transition of the positive input voltage $V_{mp}$, the NMOS FET $M_{N17}$ turns on, and the gate voltage $V_{gn}$ is lowered to vddpx multiplied by a ratio of the turn-on resistance of NMOS FET $M_{N17}$ to the sum of the turn-on resistances of the PMOS $M_{P11}$ and NMOS $M_{N17}$. Accordingly, in response to the negative transition of the positive input voltage $V_{mp}$, the gate voltage $V_{gn}$ is lowered to the overdrive voltage $V_{ovd2n}$, as previously discussed in detail in connection with level shifter 500.

FIG. 9 illustrates a schematic diagram of another exemplary $V_{gp}$ generator 900 in accordance with another aspect of the disclosure. The $V_{gp}$ generator 900 may be an exemplary detailed implementation of the $V_{gp}$ generator 560 previously discussed.

The $V_{gp}$ generator 900 includes a PMOS FET $M_{P12}$ and an NMOS FET $M_{N18}$ coupled in series in that order between the vddpx voltage rail and the GND voltage rail. A bias voltage $V_{ssx}$ is applied to a gate of the PMOS FET $M_{P12}$. The NMOS FET $M_{N18}$ is configured to receive the n_pulse generated by the assist_p generator 700 previously discussed. The gate voltage $V_{gp}$ is generated at a node between the PMOS FET $M_{P12}$ and the NMOS FET $M_{N18}$.

In operation, when the pulse n_pulse is not being generated and NMOS FET $M_{N18}$ is turned off, the gate voltage $V_{gp}$ is at substantially vddpx. When the pulse n_pulse is generated in response to a negative transition of the negative input voltage $V_{mn}$, the NMOS FET $M_{N18}$ turns on, and the gate voltage $V_{gp}$ is lowered to vddpx multiplied by a ratio of the turn-on resistance of NMOS FET $M_{N18}$ to the sum of the turn-on resistances of the PMOS $M_{P12}$ and NMOS $M_{N18}$. Accordingly, in response to the negative transition of the negative input voltage $V_{mn}$, the gate voltage $V_{gp}$ is lowered to the overdrive voltage $V_{ovd2p}$, as previously discussed in detail in connection with level shifter 500.

Figure 10:
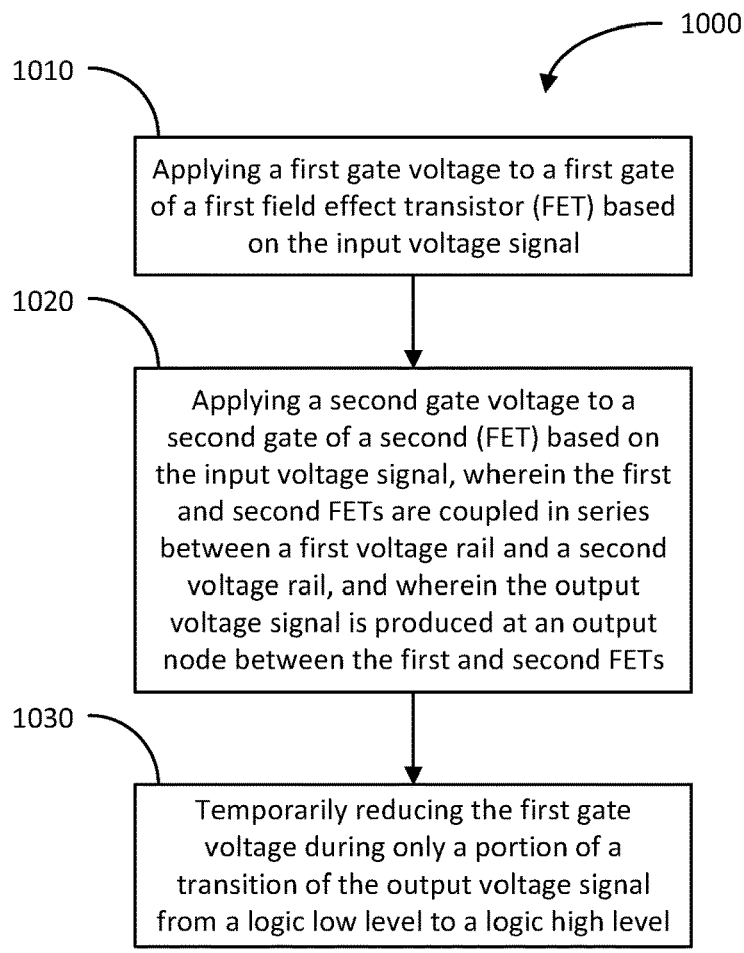
FIG. 10 illustrates a flow diagram of an exemplary method of generating an output voltage based on an input voltage in accordance with another aspect of the disclosure.

FIG. 10 illustrates a flow diagram of an exemplary method 1000 of generating an output voltage signal based on an input voltage signal in accordance with another aspect of the disclosure.

The method 1000 includes applying a first gate voltage to a first gate of a first field effect transistor (FET) based on the input voltage signal (block 1010). Examples of means for applying a first gate voltage to a first gate of a first field effect transistor (FET) based on the input voltage signal include level shifter 220, level shifting component 410, assist_n generator 530, assist_p generator 550, assist_n generator 600, and assist_p generator 700.

The method 1000 further includes applying a second gate voltage to a second gate of a second (FET) based on the input voltage signal, wherein the first and second FETs are coupled in series between a first voltage rail and a second voltage rail, and wherein the output voltage signal is produced at an output node between the first and second FETs (block 1020). Example of means for applying a second gate voltage to a second gate of a second (FET) based on the input voltage signal includes buffer 230.

The method 1000 further comprises temporarily reducing the first gate voltage during a portion of a transition of the output voltage signal from a logic low level to a logic high level (block 1030). Examples of means for temporarily reducing the first gate voltage during a portion of a transition of the output voltage from a logic low level to a logic high level include overdrive enable circuits 250 and 300, level shifter 400, assist_n generators 530 and 600, assist_p generators 550 and 700, Vgn generators 540 and 800, and Vgp generators 560 and 900.

Figure 11:
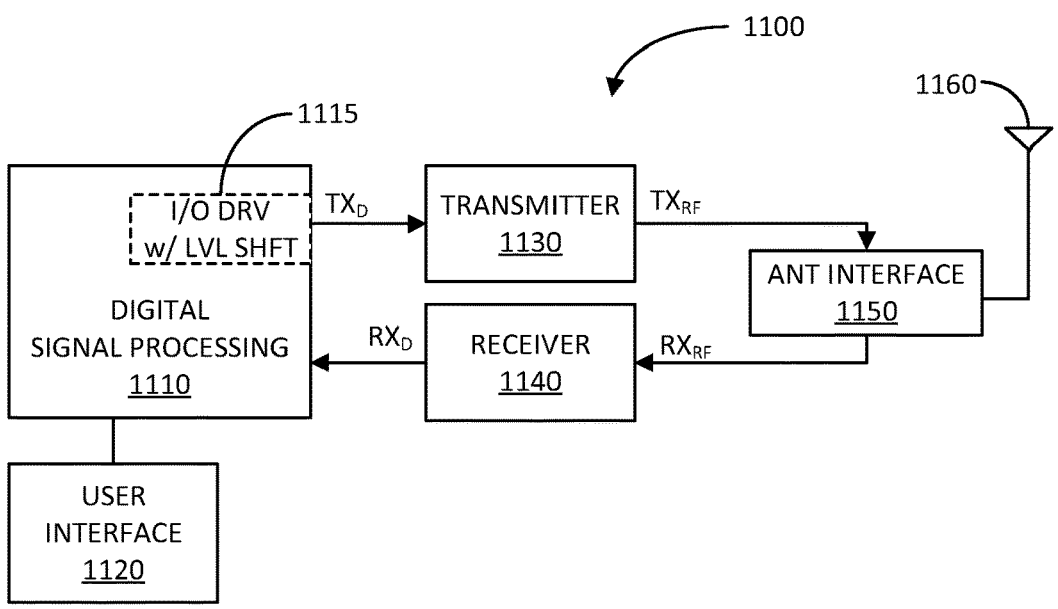
FIG. 11 illustrates a block diagram of an exemplary wireless device in accordance with another aspect of the disclosure.

FIG. 11 illustrates a block diagram of an exemplary wireless device 1100 in accordance with another aspect of the disclosure. The I/O drivers and level shifters described herein may be used in wireless device applications.

For instance, the wireless device 1100 includes a digital signal processing core 1110 including an I/O driver with level shifter 1115, a user interface 1120, a radio frequency (RF) transmitter 1130, an RF receiver 1140, an antenna interface 1150 (e.g., a diplexer), and an antenna 1160. The I/O driver with level shifter 1115 may be configured similar to I/O driver 200 with the specific level shifter 500 serving as the level shifter 220 of I/O driver 200.

Based on signals exchanged between the digital signal processing core 1110 and the user interface 1120, the digital signal processing core 1110 employing the I/O driver and level shifter 1115 generates a transmit digital signal $TX_D$. The RF transmitter 1130 generates a transmit RF signal $TX_{RF}$ by converting the transmit digital signal $TX_D$ into an analog signal, frequency upconverting the analog signal to generate an RF signal, and power amplifying the RF signal. The transmit RF signal $TX_{RF}$ is sent to the antenna 1160 via the antenna interface 1150 for transmission to one or more other wireless devices via a wireless medium.

The RF receiver 1140 may receive a receive RF signal $RX_{RF}$ from one or more other wireless devices via the antenna 1160 and the antenna interface 1150. The RF receiver 1140 generates a received digital signal $RX_D$ by low noise amplifying the receive RF signal $RX_{RF}$, frequency downconverting the amplified RF signal to generate a baseband analog signal, and converting the baseband analog signal into digital format. The digital signal processing core 1110 receives the receive digital signal $RX_D$. The digital signal processing core 1110 may process the receive digital signal $RX_D$ based on signals exchanged between the digital signal processing core 1110 and the user interface 1120.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus for generating an output voltage signal based on an input voltage signal, comprising:
    a first field effect transistor (FET) including a first gate configured to receive a first gate voltage based on the input voltage signal;
    a second FET including a second gate configured to receive a second gate voltage based on the input voltage signal, wherein the first and second FETs are coupled in series between a first voltage rail and a second voltage rail, and wherein the output voltage signal is produced at an output node between the first and second FETs;
    a gate overdrive circuit configured to temporarily reduce the first gate voltage during a first portion of a transition of the output voltage signal from a logic low level to a logic high level; and
    a third FET coupled between the output node and the first FET, wherein the third FET includes a third gate configured to receive a third gate voltage, and wherein the gate overdrive circuit is configured to temporarily reduce the third gate voltage substantially coincidental with the reduction of the first gate voltage of the first FET.

2. The apparatus of claim 1, wherein the gate overdrive circuit is further configured to raise the first gate voltage during a second portion of the transition of the output voltage signal from the logic low level to the logic high level.

3. The apparatus of claim 1, wherein the gate overdrive circuit is configured to temporarily reduce the first gate voltage below a logic low level of the first gate voltage.

4. The apparatus of claim 3, wherein the logic low level of the first gate voltage is substantially half of a supply voltage applied to the first voltage rail.

5. The apparatus of claim 1, wherein the gate overdrive circuit is configured to initiate the temporary reduction of the first gate voltage in response to a transition of the second gate voltage.

6. The apparatus of claim 1, wherein the gate overdrive circuit is configured to terminate the temporary reduction of the first gate voltage in response to the output voltage signal reaching a voltage level between the logic low level and the logic high level.

7. The apparatus of claim 1, wherein a duration of the temporarily reduction of the first gate voltage is independent of the output voltage signal.

8. The apparatus of claim 1, further comprising a fourth FET coupled in parallel with the first FET, wherein the fourth FET includes a fourth gate configured to receive a fourth gate voltage, wherein the fourth gate voltage is at another low logic level during the transition of the output voltage signal from the logic low level to the logic high level.

9. The apparatus of claim 1, wherein the first and second FETs are part of an input/output (I/O) driver or a level shifter.

10. An apparatus for generating an output voltage signal based on an input voltage signal, comprising:
- a first field effect transistor (FET) including a first gate configured to receive a first gate voltage based on the input voltage signal;
- a second FET including a second gate configured to receive a second gate voltage based on the input voltage signal, wherein the first and second FETs are coupled in series between a first voltage rail and a second voltage rail, and wherein the output voltage signal is produced at an output node between the first and second FETs;
- a gate overdrive circuit configured to temporarily reduce the first gate voltage during a first portion of a transition of the output voltage signal from a logic low level to a logic high level; and
- a third FET coupled between the output node and the first FET, wherein the third FET includes a third gate configured to receive a third gate voltage, and wherein the gate overdrive circuit is configured to temporarily reduce the third gate voltage substantially coincidental with the reduction of the first gate voltage of the first FET.

11. A method of generating an output voltage signal based on an input voltage signal, comprising:
- applying a first gate voltage to a first gate of a first field effect transistor (FET) based on the input voltage signal;
- applying a second gate voltage to a second gate of a second FET based on the input voltage signal, wherein the first and second FETs are coupled in series between a first voltage rail and a second voltage rail, and wherein the output voltage signal is produced at an output node between the first and second FETs;
- temporarily reducing the first gate voltage during a first portion of a transition of the output voltage signal from a logic low level to a logic high level;
- applying a third gate bias voltage to a third gate of a third FET coupled between the first FET and the output node; and
- temporarily reducing the third gate bias voltage substantially coincidental with the temporary reduction of the first gate voltage of the first FET.

12. The method of claim 11, further comprising raising the first gate voltage during a second portion of the transition of the output voltage signal from the logic low level to the logic high level.

13. The method of claim 11, wherein temporarily reducing the first gate voltage comprises reducing the first gate voltage to below a logic low level of the first gate voltage.

14. The method of claim 13, wherein the logic low level of the first gate voltage is substantially half of a supply voltage applied to the first voltage rail.

15. The method of claim 11, wherein temporarily reducing the first gate voltage comprises initiating the temporary reduction of the first gate voltage in response to a transition of the second gate voltage.

16. The method of claim 11, wherein temporarily reducing the first gate voltage comprises terminating the temporary reduction of the first gate voltage in response to the output voltage signal reaching a voltage level between the logic low level and the logic high level.

17. The method of claim 11, wherein a duration of the temporary reduction of the first gate voltage is independent of the output voltage signal.

18. The method of claim 11, further comprising applying a fourth gate voltage to a fourth gate of a fourth FET coupled in parallel with the first FET, wherein the fourth gate voltage is at a low logic level during the transition of the output voltage signal from the logic low level to the logic high level.

19. A method of generating an output voltage signal based on an input voltage signal, comprising:
- applying a first gate voltage to a first gate of a first field effect transistor (FET) based on the input voltage signal;
- applying a second gate voltage to a second gate of a second FET based on the input voltage signal, wherein the first and second FETs are coupled in series between a first voltage rail and a second voltage rail, and wherein the output voltage signal is produced at an output node between the first and second FETs;
- temporarily reducing the first gate voltage during a first portion of a transition of the output voltage signal from a logic low level to a logic high level;
- applying a third gate voltage to a third FET coupled between the output node and the second FET; and
- temporarily reducing the third gate voltage substantially coincidental with the temporary reduction of the first gate voltage of the first FET.

20. An apparatus for generating an output voltage signal based on an input voltage signal, comprising:
- means for applying a first gate voltage to a first gate of a first field effect transistor (FET) based on the input voltage signal;
- means for applying a second gate voltage to a second gate of a second FET based on the input voltage signal, wherein the first and second FETs are coupled in series between a first voltage rail and a second voltage rail, and wherein the output voltage signal is produced at an output node between the first and second FETs;
- means for temporarily reducing the first gate voltage during a portion of a transition of the output voltage signal from a logic low level to a logic high level;
- means for applying a third gate bias voltage to a third gate of a third FET coupled between the first FET and the output node; and
- means for temporarily reducing the third gate bias voltage substantially coincidental with the temporary reduction of the first gate voltage of the first FET.

21. The apparatus of claim 20, wherein the means for temporarily reducing the first gate voltage comprises means for reducing the first gate voltage to below a logic low level of the first gate voltage.

22. The apparatus of claim 21, wherein the logic low level of the first gate voltage is substantially half of a supply voltage applied to the first voltage rail.

23. The apparatus of claim 20, wherein the means for temporarily reducing the first gate voltage comprises means for initiating the temporary reduction of the first gate voltage in response to a transition of the second gate voltage.

24. The apparatus of claim 20, wherein the means for temporarily reducing the first gate voltage comprises means for terminating the temporary reduction of the first gate voltage in response to the output voltage signal reaching a voltage level between the logic low level and the logic high level.

25. The apparatus of claim 20, wherein a duration of the temporary reduction of the first gate voltage is independent of the output voltage signal.

26. The apparatus of claim 20, further comprising means for applying a fourth gate voltage to a fourth gate of a third FET coupled in parallel with the first FET, wherein the fourth gate voltage is at a low logic level during the transition of the output voltage signal from the logic low level to the logic high level.

27. An apparatus for generating an output voltage signal based on an input voltage signal, comprising:
- means for applying a first gate voltage to a first gate of a first field effect transistor (FET) based on the input voltage signal;
- means for applying a second gate voltage to a second gate of a second FET based on the input voltage signal, wherein the first and second FETs are coupled in series between a first voltage rail and a second voltage rail, and wherein the output voltage signal is produced at an output node between the first and second FETs;
- means for temporarily reducing the first gate voltage during a portion of a transition of the output voltage signal from a logic low level to a logic high level;
- means for applying a third gate voltage to a third FET coupled between the output node and the second FET; and
- means for temporarily reducing the third gate voltage substantially coincidental with the temporary reduction of the first gate voltage of the first FET.

* * * * *